United States Patent
Park

(10) Patent No.: US 10,102,897 B2
(45) Date of Patent: Oct. 16, 2018

(54) MEMORY DEVICE AND METHOD OF OPERATING THE SAME

(71) Applicant: SAMSUNG ELECTRONICS CO., LTD., Suwon-si, Gyeonggi-Do (KR)

(72) Inventor: Mu Hui Park, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/697,000

(22) Filed: Sep. 6, 2017

(65) Prior Publication Data

US 2018/0247685 A1 Aug. 30, 2018

(30) Foreign Application Priority Data

Feb. 24, 2017 (KR) .................. 10-2017-0024546

(51) Int. Cl.
  *G11C 16/26* (2006.01)
  *G11C 11/16* (2006.01)
  *G11C 13/00* (2006.01)
  *G11C 11/56* (2006.01)

(52) U.S. Cl.
  CPC ...... *G11C 11/1673* (2013.01); *G11C 11/5678* (2013.01); *G11C 13/0026* (2013.01); *G11C 13/0064* (2013.01); *G11C 16/26* (2013.01); *G11C 2213/72* (2013.01)

(58) Field of Classification Search
  CPC ............ G11C 11/1673; G11C 11/5678; G11C 13/0026; G11C 13/0064; G11C 2213/72
  USPC ................................................. 365/163, 203
  See application file for complete search history.

(56) References Cited

U.S. PATENT DOCUMENTS

| | | |
|---|---|---|
| 7,570,524 B2 | 8/2009 | Bedeschi et al. |
| 8,848,426 B2 | 9/2014 | Azuma et al. |
| 8,947,924 B2 | 2/2015 | Li et al. |
| 9,123,430 B2 | 9/2015 | Cernea |
| 9,147,449 B2 | 9/2015 | Wang et al. |
| 9,177,641 B2 | 11/2015 | Takahashi et al. |
| 9,336,873 B2 | 5/2016 | August et al. |
| 9,368,205 B2 | 6/2016 | Mantegazza et al. |
| 2007/0285976 A1* | 12/2007 | Happ .................. G11C 11/5678 365/163 |
| 2015/0009756 A1* | 1/2015 | D'Alessandro ........ G11C 16/26 365/185.17 |
| 2015/0179255 A1* | 6/2015 | Sarpatwari ......... G11C 13/0038 365/148 |

(Continued)

*Primary Examiner* — Ly D Pham
(74) *Attorney, Agent, or Firm* — Volentine, Whitt & Francos, PLLC

(57) ABSTRACT

A memory device includes: a resistive memory cell connected to a first node; a current supply unit providing to a sensing node a comparison current to be compared with a cell current flowing through the first node to read data stored in the resistive memory cell; a clamping unit connected between the sensing node and the first node and including a transistor and a capacitor connected to a gate of the transistor via a second node; and a sense amplifier sensing the sensing node voltage and transitioning an output value when the sensing node voltage is less than a reference voltage. The clamping unit receives a first read voltage and a boost voltage, ramps up a voltage of the first node in a first precharge mode, and adjusts a level of a second read voltage of the second node in a second precharge mode.

20 Claims, 13 Drawing Sheets

(56) References Cited

U.S. PATENT DOCUMENTS

2015/0350585 A1* 12/2015 Kim .................. H04N 5/378
                                                    348/308
2016/0055916 A1*  2/2016 Louie ................ G11C 16/26
                                                    365/185.21

* cited by examiner

FIG. 2

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| PERIPHERY(3) | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

MEMORY DEVICE AND METHOD OF OPERATING THE SAME

CROSS-REFERENCE TO RELATED APPLICATION

This application claims the benefit of Korean Patent Application No. 10-2017-0024546 filed on Feb. 24, 2017 in the Korean Intellectual Property Office, the disclosure of which is incorporated herein in its entirety by reference.

BACKGROUND

The current disclosure relates to a memory device and a method of operating the same.

Examples of nonvolatile memories using resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material such as a chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

In particular, a phase-change material of a PRAM cell assumes a crystalline state or an amorphous state as it is cooled after being heated. The phase-change material has low resistance in the crystalline state and has high resistance in the amorphous state. Therefore, the crystalline state may be defined as corresponding or indicating set data or data 0, and the amorphous state may be defined as corresponding or indicating reset data or data 1.

An access element or a selector that controls a PRAM cell may be implemented as a diode type, a transistor type, or an ovonic threshold switch (OTS) type.

SUMMARY

Aspects of the disclosure provide a memory device which can secure a sensing margin for memory cells while reducing power consumption.

Aspects of the disclosure also provide a method of operating a memory device which can secure a sensing margin for memory cells while reducing power consumption.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, there is provided a memory device including a resistive memory cell which is connected to a first node and comprises a variable resistive element and an access element controlling a current flowing through the variable resistive element; a current supply unit which provides a comparison current to be compared with a cell current flowing through the first node to a sensing node in order to read data stored in the resistive memory cell; a clamping unit which is connected between the sensing node and the first node and comprises a transistor and a capacitor connected to a gate of the transistor by a second node; and a sense amplifier which senses the sensing node and transitions an output value when a voltage level of the sensing node is lower than a reference voltage, wherein the clamping unit receives a first read voltage and a boost voltage, ramps up a voltage of the first node in a first precharge mode, and adjusts a level of a second read voltage of the second node in a second precharge mode.

According to another aspect of the disclosure, there is provided a memory device including a resistive memory cell which is connected to a first node and comprises a variable resistive element and an access element controlling a current flowing through the variable resistive element; and a clamping unit which is connected to the first node comprises a transistor, a capacitor connected to a gate of the transistor by a second node, a first switch receiving a first read voltage and providing the first read voltage to the transistor and the capacitor, a second switch connecting the capacitor and the first node, and a third switch receiving a boost voltage and providing the boost voltage to the capacitor, wherein, using the first through third switches, the clamping unit ramps up a voltage of the first node in a first precharge mode and adjusts a level of a second read voltage of the second node in a second precharge mode.

According to still another aspect of the disclosure, there is provided a method of operating a memory device including providing a resistive memory cell which is connected to a first node and comprises a variable resistive element and an access element controlling a current flowing through the variable resistive element; providing a comparison current, which is to be compared with a cell current flowing through the first node, to a sensing node in order to read data stored in the resistive memory cell; ramping up a voltage of the first node in a first precharge mode; adjusting a voltage level of a second node in a second precharge mode; and sensing the sensing node and transitioning an output value when a voltage level of the sensing node is lower than a reference voltage.

According to yet another aspect of the disclosure, there is provided a memory device including a transistor which is included in a nonvolatile memory cell; a capacitor which is connected to a gate of the transistor; a first switch which receives a first read voltage and provides the first read voltage to the transistor and the capacitor; a second switch which connects the capacitor and a source of the transistor; and a third switch which receives a boost voltage and provides the boost voltage to the capacitor, wherein the first through third switches form different circuit configurations in a first operation mode and a second operation mode.

According to a further aspect of the disclosure, a memory device comprises: a memory cell which is connected to a sensing node via a first node, the sensing node being configured to be precharged to a precharge voltage prior to reading data from the memory cell; and a clamping unit which is connected between the first node and the sensing node, and which includes a transistor and a capacitor which is configured to be selectively connected between the first node and a control terminal of the transistor, wherein the clamping unit is configured to ramp up a voltage of the first node and to charge a capacitor in a first precharge period, and to adjust a level of the voltage of the first node in a second precharge period, using a stored voltage charged into the capacitor during the first precharge period.

BRIEF DESCRIPTION OF THE DRAWINGS

These and/or other aspects will become apparent and more readily appreciated from the following description of the embodiments, taken in conjunction with the accompanying drawings.

FIG. 2 is a block diagram of a memory device.

DETAILED DESCRIPTION

Figure 1:
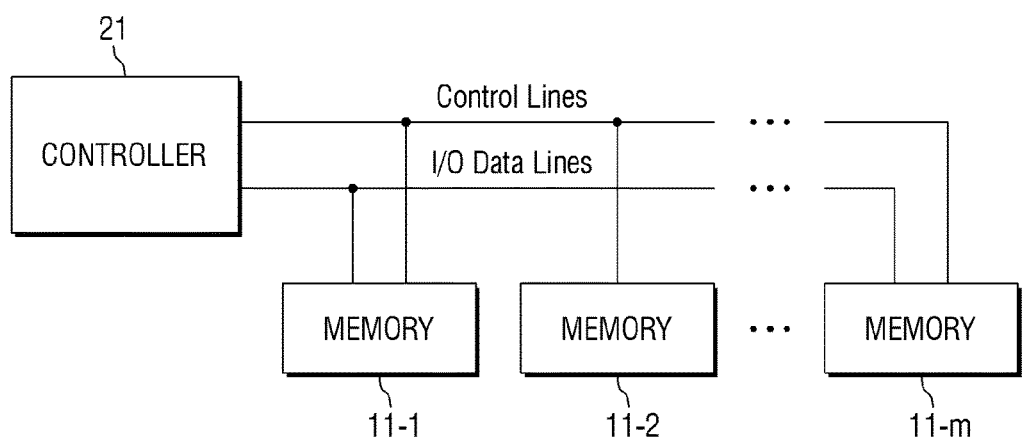
FIG. 1 is a block diagram of a memory system.

FIG. 1 is a block diagram of a memory system according to embodiments.

Referring to FIG. 1, embodiments of a memory system may include a plurality of memory devices 11_1 through 11_m (where m is a natural number) and a controller 21.

Memory devices 11_1 through are connected to controller 21 by control lines and input/output (I/O) data lines. For example, controller 21 may provide various commands (such as a write command and a read command) to memory devices 11_1 through 11_m through the control lines. In addition, controller 21 may exchange data with memory devices 11_1 through 11_m through the I/O data lines.

In the drawing, memory devices 11_1 through 11_m share the control lines and the I/O data lines with each other. However, the disclosure is not limited to this case. For example, memory devices 11_1 through 11_m may share only the I/O data lines and may not share the control lines.

Memory devices 11_1 through 11_m may include various kinds of memories. Memory devices 11_1 through 11_m may include volatile memory devices such as a dynamic random access memory (DRAM) and nonvolatile memory devices such as a NAND flash memory and a NOR flash memory. In addition, memory devices 11_1 through may include nonvolatile memory devices (i.e., resistive memory devices) using a resistance material, such as a phase-change random access memory (PRAM), a resistive RAM (RRAM), and a magnetic RAM (MRAM).

FIG. 2 is a block diagram of a memory device. In FIG. 2, a nonvolatile memory device composed of sixteen memory banks is illustrated as an example. However, the disclosure is not limited to this example.

Referring to FIG. 2, the nonvolatile memory device includes a memory cell array, a plurality of sense amplifiers and write drivers 2_1 through 2_8, and a peripheral circuit region 3.

The memory cell array may be composed of a plurality of memory banks 1_1 through 1_16, and each of memory banks 1_1 through 1_16 may be composed of a plurality of memory blocks BLK0 through BLK7. Each of the memory blocks BLK0 through BLK7 includes a plurality of nonvolatile memory cells arranged in a matrix. In some embodiments, each of memory banks 1_1 through 1_16 includes eight memory blocks.

Although not specifically illustrated in the drawing, a row select circuit and a column select circuit are placed to correspond to each of memory banks 1_1 through 1_16. The row select circuit and the column select circuit respectively select a row and a column of resistive memory cells to be written or read.

Each of the sense amplifiers and write drivers 2_1 through 2_8 is placed to correspond to two of memory banks 1_1 through 1_16 and executes read and write operations on two corresponding memory banks. In some embodiments, each of the sense amplifiers and write drivers 2_1 through 2_8 corresponds to two of memory banks 1_1 through 1_16. However, in other embodiments, each of the sense amplifiers and write drivers 2_1 through 2_8 can also correspond to one memory bank or four memory banks.

Peripheral circuit region 3 may include a plurality of logic circuit blocks and a voltage generator needed to operate the column select circuit, the row select circuit, and the sense amplifiers and write drivers 2_1 through 2_8.

Figure 3A:
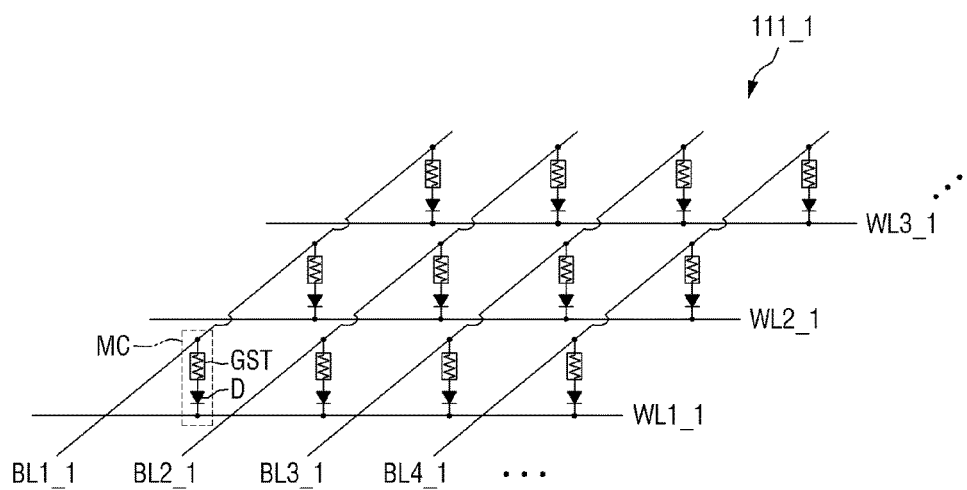
FIG. 3A, FIG. 3B and FIG. 4 are diagrams illustrating a memory cell array of FIG. 2.
Figure 3B:
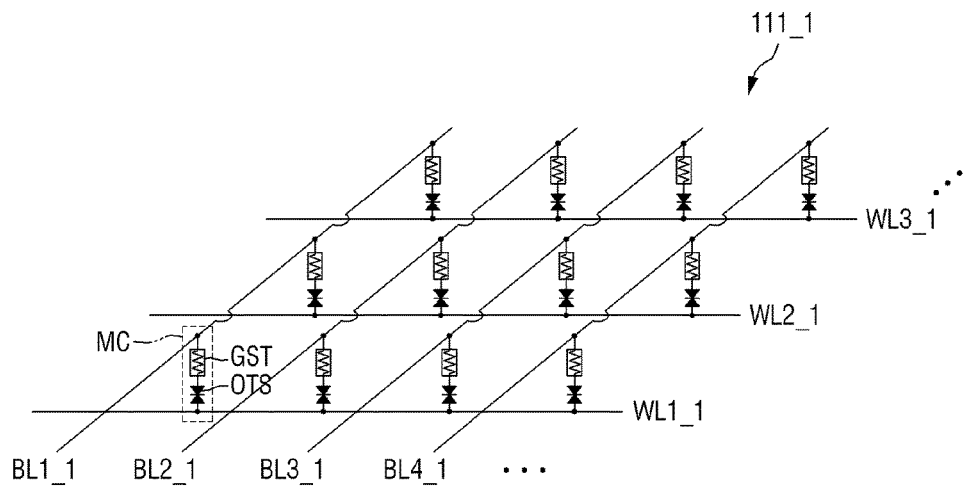
Figure 4:
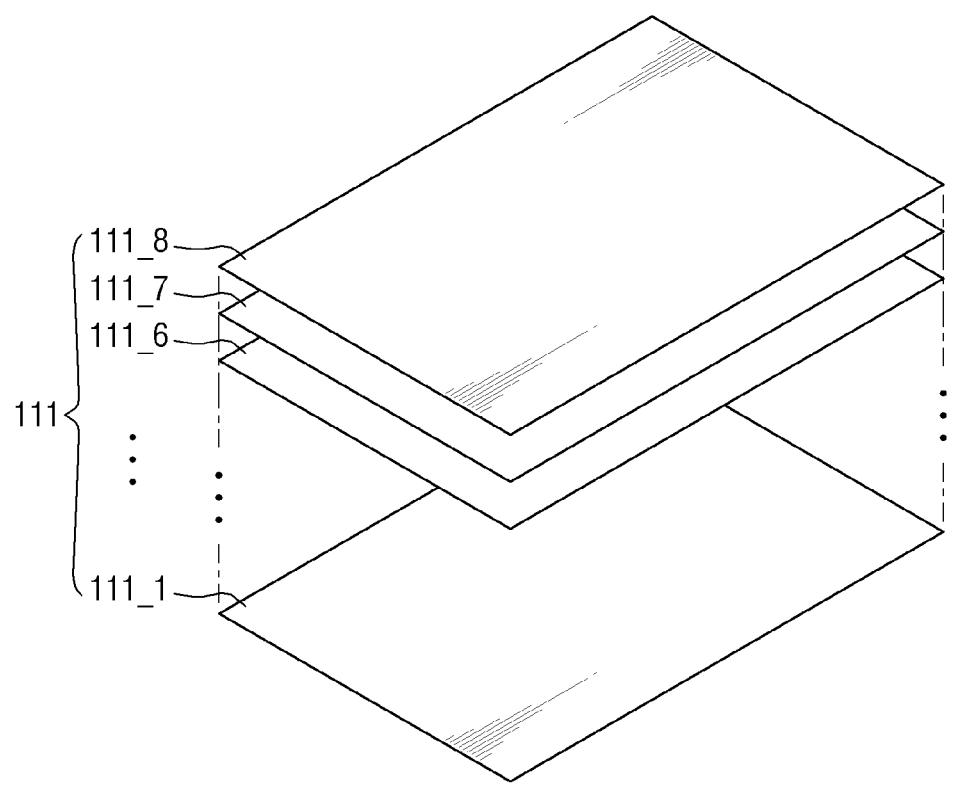

FIGS. 3A, 3B and 4 are diagrams illustrating the memory cell array of FIG. 2.

Referring to FIGS. 3A and 3B, the memory cell array may have a cross-point structure. In the cross-point structure, one memory cell is formed in an area where one line crosses another line. For example, bit lines BL1_1 through BL4_1 may extend in a first direction, and word lines WL1_1 through WL3_1 may extend in a second direction to cross the bit lines BL1_1 through BL4_1. A resistive memory cell MC may be formed in an area where each of the bit lines BL1_1 through BL4_1 crosses each of the word lines WL1_1 through WL3_1.

Here, when the resistive memory cell MC is a PRAM, it may include a variable resistive element GST which contains a phase-change material and an access element which controls a current flowing through the variable resistive element GST.

In FIG. 3A, the access element may be a diode D or a transistor (not illustrated) connected in series to the variable resistive element GST. In FIG. 3B, the access element may be an ovonic threshold switch (OTS) connected in series to the variable resistive element GST.

Examples of the phase-change material include combinations of two elements such as GaSb, InSb, InSe, $Sb_2Te_3$ and GeTe, combinations of three elements such as GeSbTe, GaSeTe, InSbTe, $SnSb_2Te_4$ and InSbGe, and combinations of four elements such as AgInSbTe, (GeSn)SbTe, GeSb (SeTe) and $Te_{81}Ge_{15}Sb_2S_2$. Of these, GeSbTe composed of germanium (Ge), antimony (Sb) and tellurium (Te) may be mainly used.

On the other hand, when the resistive memory cell MC is an RRAM, the variable resistive element may include, for example, NiO or perovskite. The perovskite may be a composition such as manganite ($Pr_{0.7}Ca_{0.3}MnO_3$, $Pr_{0.5}Ca_{0.5}MnO_3$, other PCMO, LCMO, etc.), titanate (STO: Cr), or zirconate (SZO:Cr, $Ca_2Nb_2O_7$:Cr, $Ta_2O_5$:Cr). A filament may be formed in the variable resistive element GST. The filament serves as a current path of a cell current flowing through the resistive memory cell MC.

The memory cell array may have a 3D stack structure as illustrated in FIG. 4. The 3D stack structure may denote a structure in which a plurality of memory cell layers 111_1 through 111_8 are vertically stacked. In FIG. 4, eight memory cell layers 111_1 through 111_8 are stacked. However, the disclosure is not limited to this case. Here, each of memory cell layers 111_1 through 111_8 may include a plurality of memory cell groups and/or a plurality of redundancy memory cell groups. When the memory cell array has the 3D stack structure, each of memory cell layers 111_1 through 111_8 may have, but not necessarily have, the cross-point structure of FIG. 3.

Figure 5:
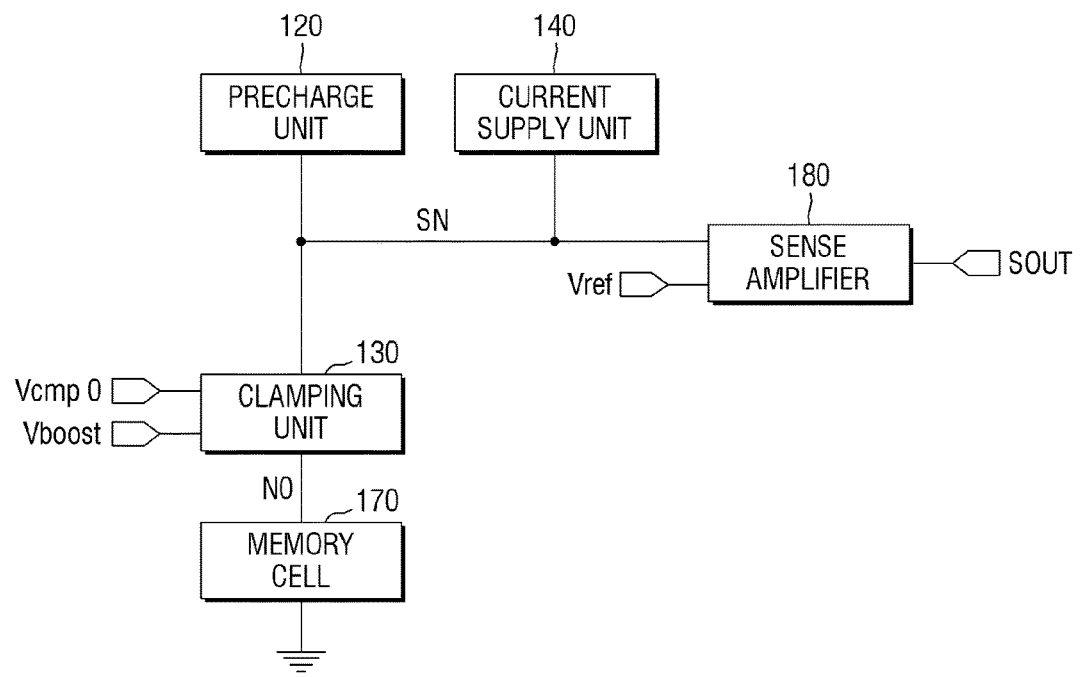
FIG. 5 is a block diagram of a memory device.

FIG. 5 is a block diagram of a memory device.

Referring to FIG. 5, the memory device includes a precharge unit 120, a clamping unit 130, a current supply unit 140, a resistive memory cell 170, and a sense amplifier 180.

Precharge unit 120 is connected to a sensing node SN to precharge the sensing node SN. For example, precharge unit 120 may provide a power supply voltage VDD to the sensing node SN before performing a read operation on resistive memory cell 170.

Clamping unit 130 is connected between a first node N0 and the sensing node SN and receives a first read voltage Vcmp0 and a boost voltage Vboost to ramp up the voltage of the first node N0.

Current supply unit 140 supplies a comparison current Ibias, which is to be compared with a cell current Icell flowing through the first node N0, to the sensing node SN so as to read data stored in resistive memory cell 170.

Resistive memory cell 170 is connected to the first node N0 and includes a variable resistive element 171 and an access element 172 (see FIG. 6) which controls a current flowing through variable resistive element 171. As described above with reference to FIGS. 3A and 3B, access element 172 may be a diode D connected in series to the variable resistance element GST or may be an OTS connected in series to the variable resistance element GST.

Sense amplifier 180 senses the sensing node SN and transitions output value SOUT when the voltage level of the sensing node SN is less than a reference voltage Vref.

In the current embodiment, a period during which precharge unit 120 precharges the sensing node SN may be divided into a first precharge mode and a second precharge mode according to the operation of clamping unit 130.

A first precharge period during which clamping unit 130 ramps up the voltage of the first node N0 while precharge unit 120 is precharging the sensing node SN is defined as the first precharge mode, and then a second precharge period during which clamping unit 130 cancels a precharge, offset generated by the first node N0 in the first precharge mode is defined as the second precharge mode.

When clamping unit 130 ramps up the voltage of the first node N0, the voltage level of the first node N0 may be changed according to data stored in resistive memory cell 170. For example, the voltage level of the first node N0 when the data stored in resistive memory cell 170 corresponds to RESET data may be greater than the voltage level of the first node N0 when the data stored in resistive memory cell 170 corresponds to SET data.

The difference in voltage level that occurs during precharging is called a precharge offset. Since the precharge offset should be taken into consideration to perform a read operation on resistive memory cell 170, the sensing margin of the memory device can be reduced. Therefore, the precharge offset should be cancelled in order to secure an increased sensing margin of the memory device.

To cancel the precharge offset, an operational transconductance amplifier (OTA) may be employed in clamping unit 130. In this case, an input of the OTA may be connected to the first node N0 by a negative feedback loop in order to prevent the generation of the precharge offset by the first node N0. However, the OTA has drawbacks in that it consumes a lot of power and has high complexity in its design for securing the stability of the feedback loop.

In this regard, there is a need for a method of securing a sensing margin for memory cells while reducing power consumption. In various embodiments, while the sensing node SN is being precharged, clamping unit 130 ramps up the voltage of the first node N0 (the first precharge mode) and then cancels the precharge offset generated by the first node N0 using a capacitor C. This will be described in detail later with reference to FIGS. 6 through 9.

Figure 6:
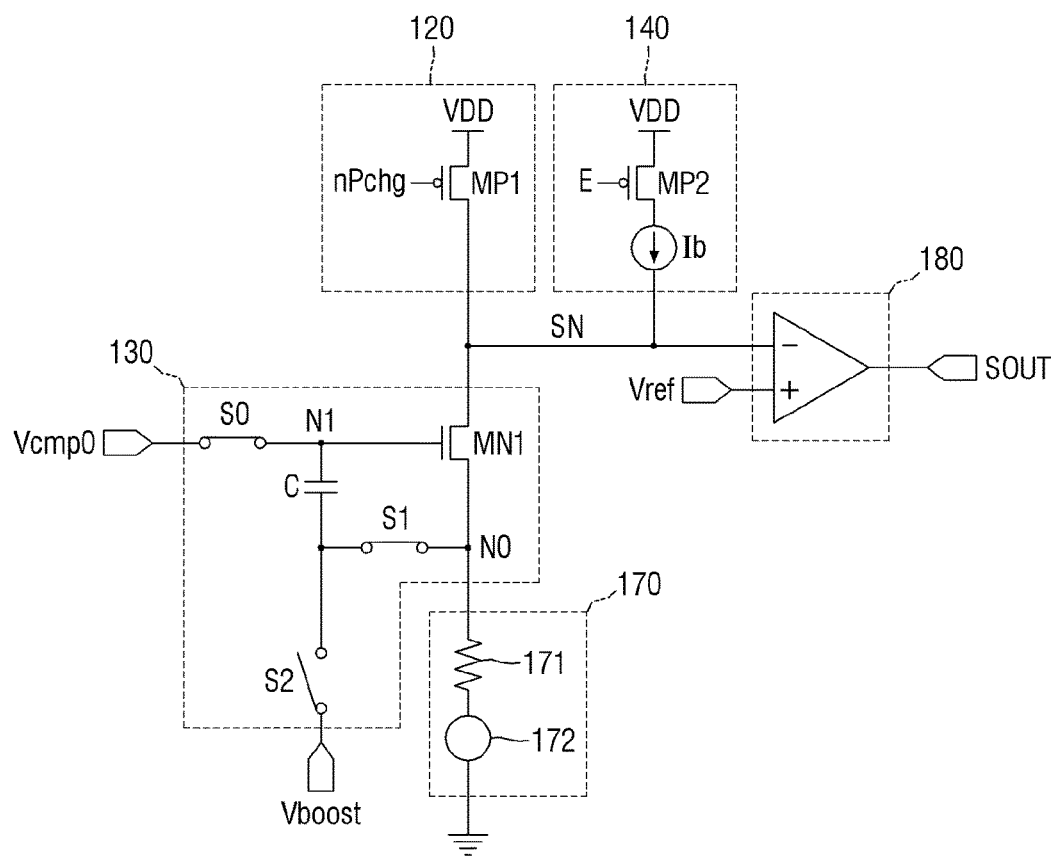
FIG. 6, FIG. 7, and FIG. 8 are circuit diagrams of the memory device illustrated in FIG. 5.
Figure 7:
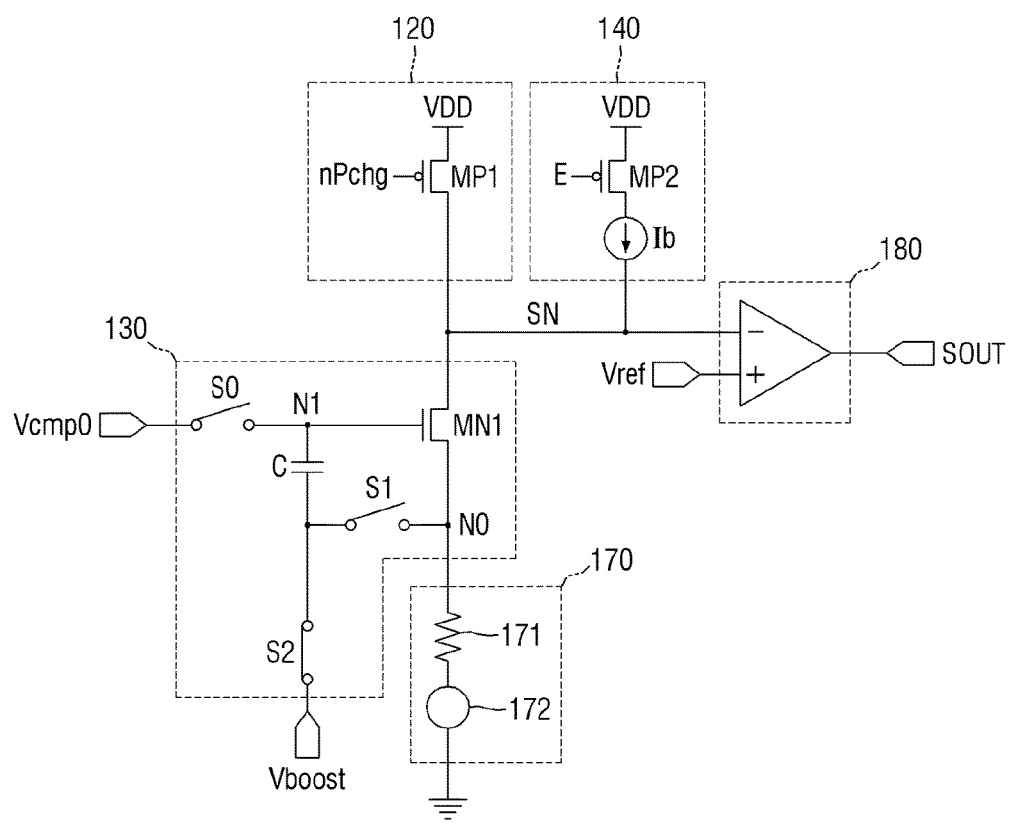
Figure 8:
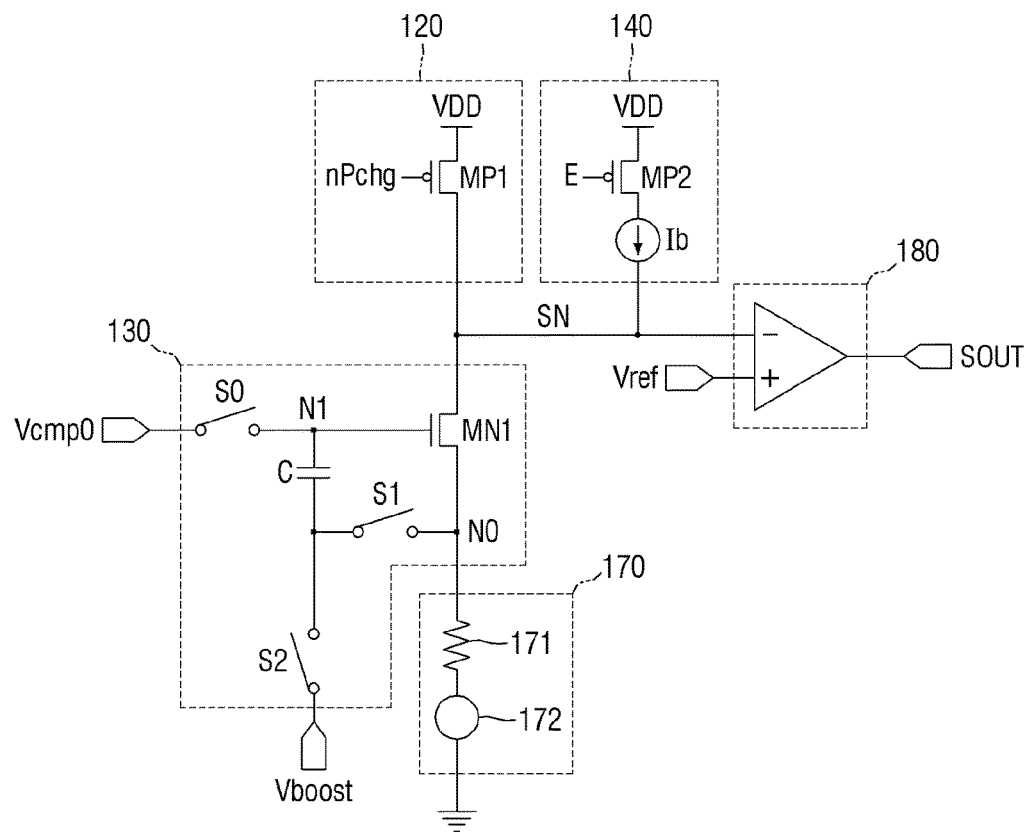

FIGS. 6 through 8 are circuit diagrams of the memory device illustrated in FIG. 5.

Referring to FIG. 6, precharge unit 120 may be implemented using a P-type transistor MP1 gated by an nPchg signal. However, the scope of the disclosure is not limited to this case, and the specific implementation of precharge unit 120 can be changed as desired.

Current supply unit 140 may be implemented using a P-type transistor MP2 gated by an E signal and a current source Ib. However, the scope of the disclosure is not limited to this case, and the specific implementation of current supply unit 140 can be changed as desired.

Resistive memory cell 170 includes variable resistive element 171 and access element 172 which controls a current flowing through variable resistive element 171. Resistive memory cell 170 is connected to the first node N0.

Clamping unit 130 includes a transistor MN1 and the capacitor C. The transistor MN1 may be an N-type transistor MN1 gated by a second read voltage Vcmp1 corresponding to a voltage of a second node N1. The capacitor C may be connected to a gate of the transistor MN1 at the second node N1.

Clamping unit 130 may ramp up the voltage of the first node N0 in the first precharge mode and adjust the level of the second read voltage Vcmp1 of the second node N1 in the second precharge mode by using the capacitor C.

The capacitor C may sample a gate-source voltage VGS of the transistor MN1 in the first precharge mode and adjust the voltage level of the second node N1 using the gate-source voltage VGS of the transistor MN1 and the boost voltage Vboost in the second precharge mode.

For example, clamping unit 130 may increase the level of the second read voltage Vcmp1 when the data stored in resistive memory cell 170 corresponds to SET data, and reduce the level of the second read voltage Vcmp1 when the data stored in resistive memory cell 170 corresponds to RESET data.

The second read voltage Vcmp1 thus adjusted can cancel a precharge offset generated by the first node N0, and the memory device according to the current embodiment can perform a read operation on resistive memory cell 170 based on the second read voltage Vcmp1 adjusted by clamping unit 130.

In particular, in the current embodiment, clamping unit 130 may include switches S0 through S2.

A first switch S0 may provide the first read voltage Vcmp0 to the transistor MN1 and the capacitor C, a second switch S1 may connect the capacitor C and the first node N0, and a third switch S2 may provide the boost voltage Vboost to the capacitor C. However, the scope of the disclosure is not limited to this case, and the specific implementation can be changed as desired.

Referring to FIG. 6, the first switch S0 and the second switch S1 are closed, and the third switch S2 is opened. FIG. 6 corresponds to the first precharge mode. The first read voltage Vcmp0 is provided to the gate of the transistor MN1 and an end of the capacitor C, and the other end of the capacitor C is connected to the first node N0. Accordingly, the capacitor C samples the gate-source voltage VGS of the transistor MN1.

Referring to FIG. 7, the first switch S0 and the second switch S1 are opened, and the third switch S2 is closed. FIG. 7 corresponds to the second precharge mode. The boost voltage Vboost is provided to the capacitor C instead of the first read voltage Vcmp0 being provided to the capacitor C. In addition, the capacitor C and the first node N0 are disconnected.

Accordingly, the second read voltage Vcmp1 of the second node N1 is determined by the gate-source voltage VGS of the transistor MN1 and the boost voltage Vboost. For example, the second read voltage Vcmp1 of the second node N1 may be determined by the sum of the gate-source voltage VGS of the transistor MN1 and the boost voltage Vboost.

The second read voltage Vcmp1 thus adjusted can cancel the precharge offset generated by the first node N0, and the memory device can perform a read operation on resistive memory cell 170 based on the adjusted second read voltage Vcmp1.

Referring to FIG. 8, all of the switches S0 through S2 are opened. FIG. 8 corresponds to a general develop operation performed after the sensing node SN is precharged and after the precharge offset generated by the first node N0 is cancelled.

Figure 9:
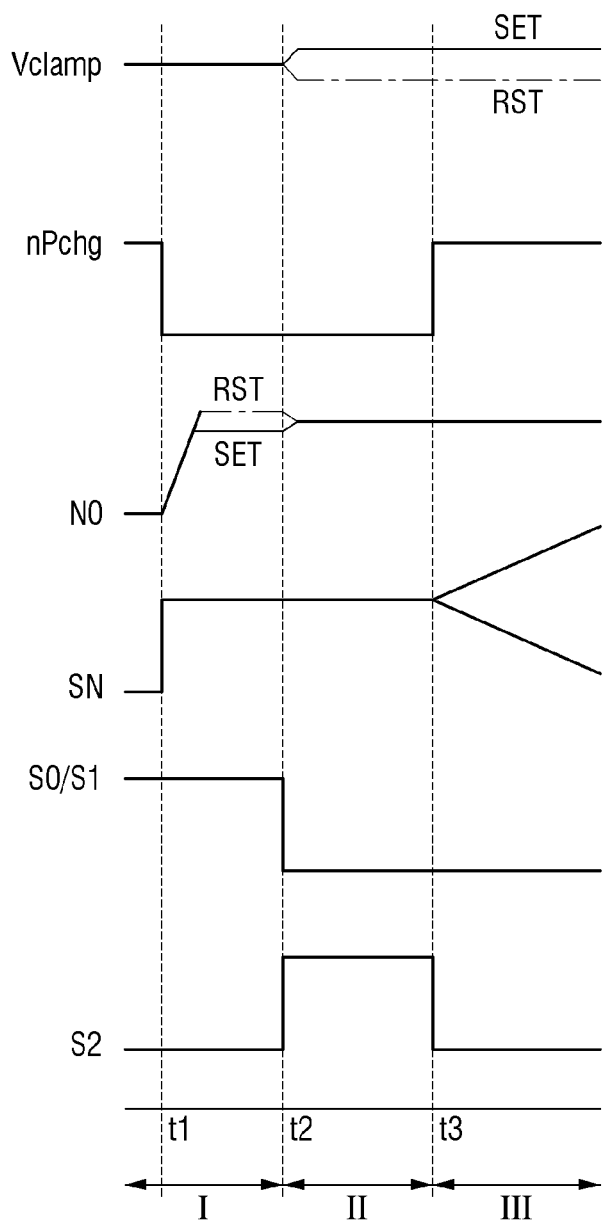
FIG. 9 is a timing diagram for explaining a method of operating a memory device.

FIG. 9 is a timing diagram for explaining a method of operating a memory device.

Referring to FIG. 9, the method of operating a memory device may be divided into a first section I (i.e., first precharge period), a second section II (i.e., second precharge period), and a third section III (i.e., develop period).

The first section I corresponds to the first precharge mode described above with reference to FIG. 6. In the first section I, the first switch S0 and the second switch S1 are closed, and the third switch S2 is opened.

Specifically, the sensing node SN is precharged according to the nPchg signal transitioned at a time t1.

At this time, the voltage level of the first node N0 is ramped up and then clamped by clamping unit 130. As is apparent from FIG. 9, the voltage level of the first node N0 when the data stored in resistive memory cell 170 corresponds to RESET data is greater than the voltage level of the first node N0 when the data stored in resistive memory cell 170 corresponds to SET data. Therefore, a precharge offset is generated, as described above.

The second section II corresponds to the second precharge mode described above with reference to FIG. 7. In the second section II, the first switch S0 and the second switch S1 are opened, and the third switch S2 is closed.

Specifically, as the states of the first through third switches S0 through S2 are changed at a time t2, the second read voltage Vcmp1 provided to the second node N1 is adjusted. For example, as illustrated in FIG. 9, when the data stored in resistive memory cell 170 corresponds to SET data, the level of the second read voltage Vcmp1 may be increased. On the other hand, when the data stored in cell 170 corresponds to RESET data, the level of the second read voltage Vcmp1 may be reduced.

Accordingly, the precharge offset generated by the first node N0 is cancelled in the second section II.

The third section III corresponds to the develop mode described above with reference to FIG. 8. In the third section III, all of the switches S0 through S2 are opened. In addition the memory device may perform a read operation on the resistive memory cell 170 based on the second read voltage Vcmp1 adjusted by clamping unit 130.

According to the various embodiments described so far, while the sensing node SN is being precharged, clamping unit 130 ramps up the voltage of the first node N0 and then cancels the precharge offset generated by the first node N0 using the capacitor C. In this way, it is possible to easily secure a sensing margin for memory cells while reducing power consumption.

As described above with respect to FIGS. 5-9, in some embodiments a memory device includes a memory cell which is connected to a sensing node via a first node, the sensing node being configured to be precharged to a precharge voltage prior to reading data from the memory cell. A clamping unit is connected between the first node and the sensing node, and includes a transistor and a capacitor which is configured to be selectively connected between the first node and the control terminal (e.g., gate) of the transistor. The clamping unit is configured to ramp up a voltage of the first node and to charge a capacitor in a first precharge period, and to adjust a level of the voltage of the first node in a second precharge period, using a stored voltage charged into the capacitor during the first precharge period.

Figure 10:
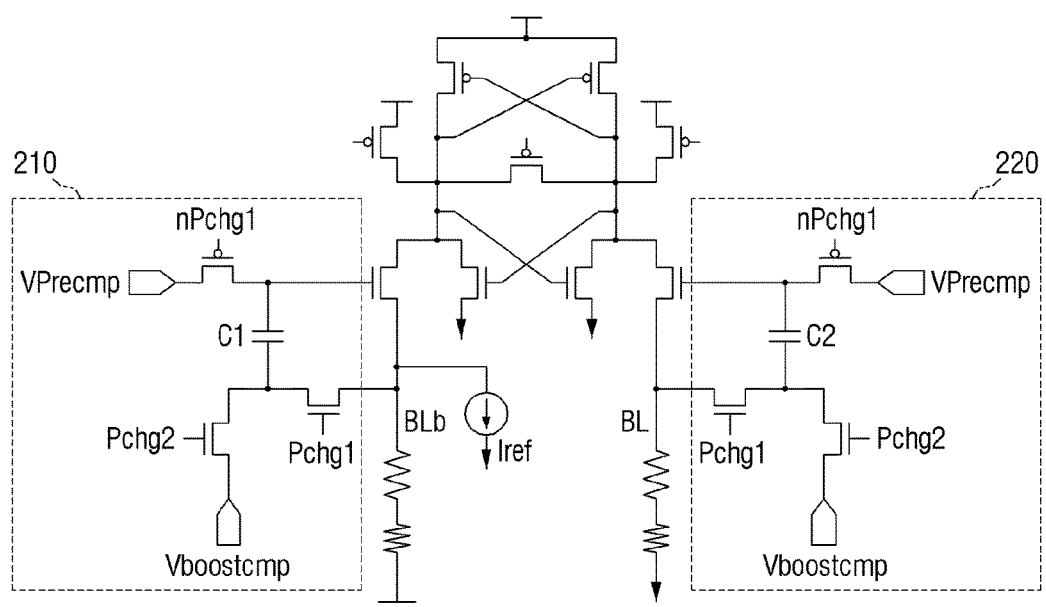
FIG. 10 is a circuit diagram of a memory device.

FIG. 10 is a circuit diagram of a memory device.

Referring to FIG. 10, the memory device may be implemented to perform differential sensing.

However, a precharge offset generated by a node BL and a node BLb not only can affect the sensing margin of the memory device that performs differential sensing, but can also degrade the performance of the memory device.

To address this problem, the design of clamping unit 130 described above with reference to FIGS. 5 through 9 may be applied to a differential sensing circuit 200 of FIG. 10.

For example, a circuit 210 including a plurality of switches nPchg1, Pchg1 and Pchg2 and a capacitor C1 connected between the switches may be implemented as illustrated in FIG. 10 on a left side of differential sensing circuit 200. The switches may correspond to the first through third switches S0 through S2 of clamping unit 130 described above and may be operated by nPchg1, Pchg1 and Pchg2 signals. Accordingly, in a first mode, a voltage VPrecmp may be provided to a gate of a left n-channel metal oxide semiconductor (NMOS) transistor of differential sensing circuit 200 and to the capacitor. In a second mode, a boost voltage Vboostcmp may be provided to the capacitor to adjust the voltage level of the gate of the left NMOS transistor such that the precharge offset generated by the node BLb can be cancelled.

Likewise, a circuit 220 including a plurality of switches and a capacitor C2 connected between the switches may be implemented as illustrated in FIG. 10 on a right side of differential sensing circuit 200. The switches may correspond to the first through third switches S0 through S2 of clamping unit 130 described above and may be operated by nPchg1, Pchg1 and Pchg2 signals. Accordingly, in the first mode, a voltage VPrecmp may be provided to a gate of a right NMOS transistor of differential sensing circuit 200 and to the capacitor. In the second mode, a boost voltage Vboostcmp may be provided to the capacitor to adjust the voltage level of the gate of the right NMOS transistor such that the precharge offset generated by the node BL can be cancelled.

In this way, it is possible to easily secure the memory cell sensing margin of differential sensing circuit 200 while reducing power consumption.

Figure 11A:
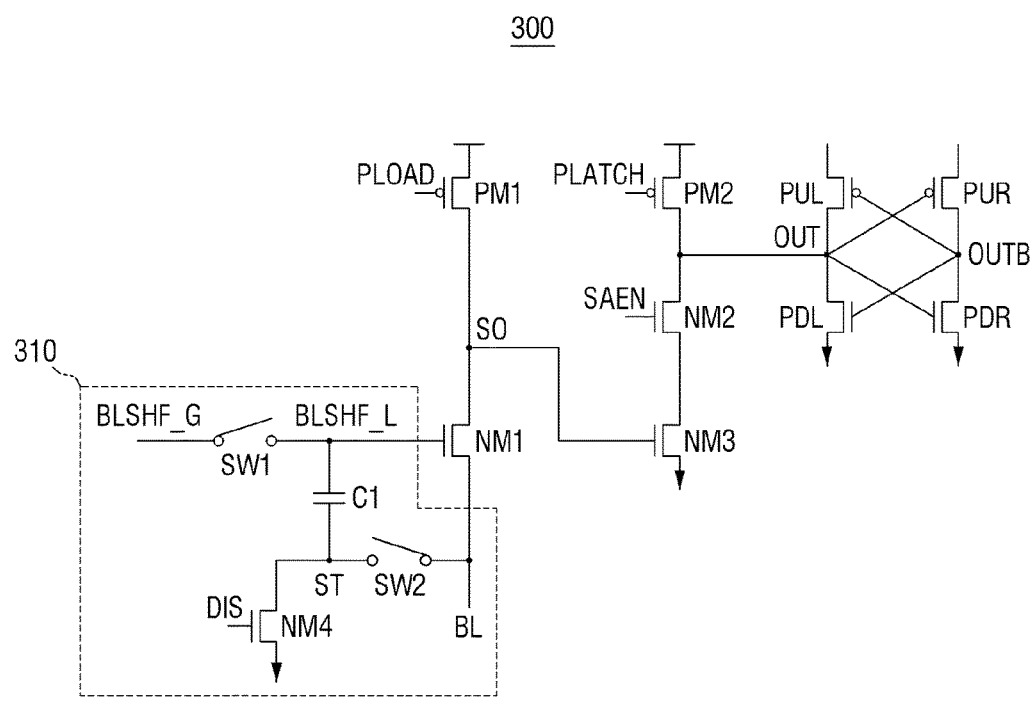
FIG. 11A and FIG. 11B are a circuit diagram and a block diagram of a memory device.
Figure 11B:
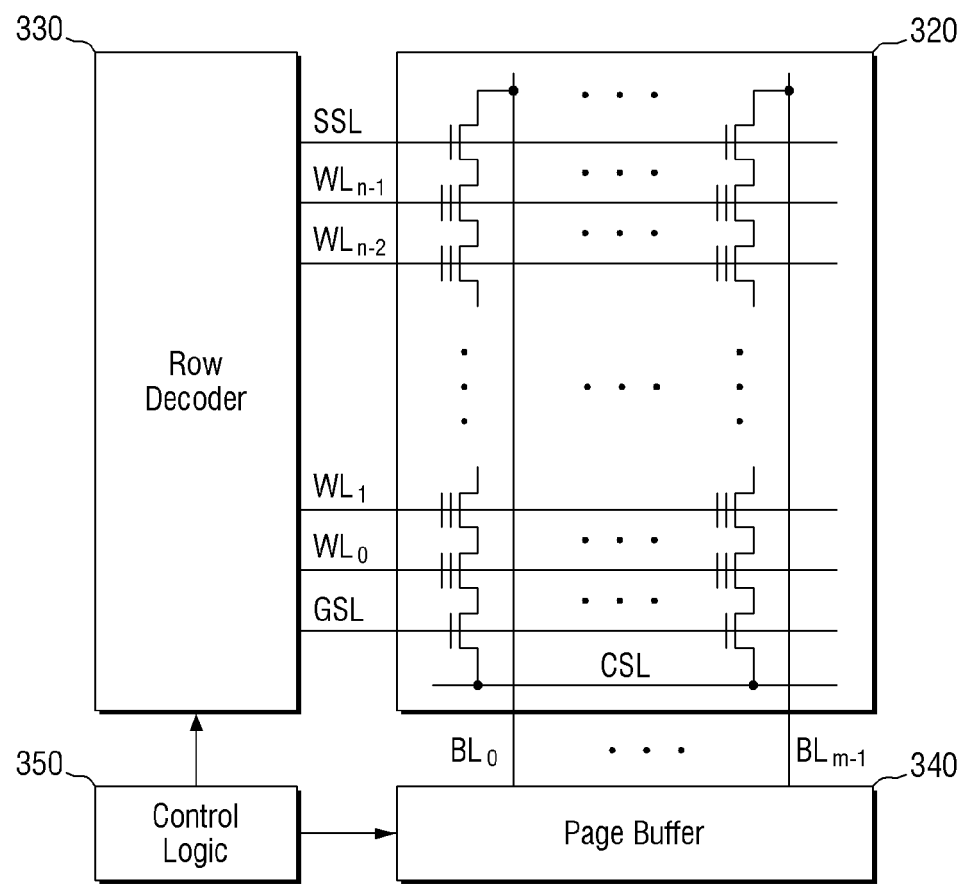

FIGS. 11A and 11B are a circuit diagram and a block diagram of a memory device.

FIG. 11A illustrates a circuit 310 which is implemented in a sensing circuit 300 of a NAND flash memory cell and corresponds to the design of clamping unit 130 described above with reference to FIGS. 5 through 9. FIG. 11B illustrates a NAND flash device in which sensing circuit 300 of the memory cell is implemented.

Referring to FIG. 11B, the NAND flash device includes a memory cell array 320, a row decoder 330, a page buffer 340, and a control logic 350.

Memory cell array 320 is a storage area for storing information. Memory cells included in memory cell array 320 are disposed at intersections of a plurality of word lines WL0 through WLn−1 and a plurality of bit lines BL0 through BLm−1, respectively. Each of the memory cells may store 1-bit data or n-bit data (where n is an integer of 2 or more). Page buffer 340 is further provided in the flash memory to store data in memory cell array 320 or to read data from memory cell array 320.

Row decoder 330 decodes a row address received from a row address buffer and selects any one of the word lines WL0 through WLn−1 based on the decoding result. Word line voltages are provided to the selected word line according to an operation mode. For example, the word line voltages include a word line program voltage, a pass voltage, a verify voltage, an erase voltage, and a read voltage.

Page buffer 340 senses data from a page of memory cell array 320 and temporarily stores the data or temporarily stores data to be programmed in a selected page. Page buffer 340 is controlled by control logic 350 to operate as a sense amplifier or a write driver according to the operation mode. In a read/verify operation, page buffer 340 senses data from memory cells of a selected word line through the bit lines BL0 through BLm−1. In a program operation, page buffer 340 supplies a power supply voltage (or a program-inhibited voltage) or a ground voltage (or a program voltage) to the bit lines BL0 through BLm−1 according to data to be programmed.

Control logic 350 receives control signals (e.g., /CE, /RE, /WE/, CLE, ALE, /WP, etc.) from an external memory controller and controls all aspects of the memory cells of nonvolatile memory cell array 320 related to program/erase/read/verify operations. Control logic 500 may include a high-voltage generating circuit which generates high voltages required for the program/erase/read/verify operations of the memory cells. For example, in a program operation, the high-voltage generating circuit may provide a program voltage to a selected word line and a pass voltage to an unselected word line. In a read operation, the high-voltage generating circuit may provide a read voltage to the selected word line and a ground voltage to the unselected word line.

Referring to FIG. 11A, circuit 300 for sensing the memory cells of memory cell array 320 may also need to cancel a precharge offset generated by a node BL.

In this case, the design of clamping unit 130 described above with reference to FIGS. 5 through 9 may be applied to sensing circuit 300 of the NAND flash memory cell of FIG. 11.

For example, circuit 310 including a plurality of switches SW1, SW2 and NM4 and a capacitor C2 connected between the switches SW1, SW2 and NM4 may be implemented so as to be connected to the gate and source of a transistor NM1 (shown on the left side of transistor NM1 in FIG. 11A). The switches SW1, SW2 and NM4 may correspond to the first through third switches S0 through S2 of the clamping unit 130 described above, and the switch NM4 may be operated by a DIS signal. Accordingly, in a first mode, a read voltage having a predetermined value is provided to a node BLSHF_G, a gate of the transistor NM1, and the capacitor C1. In a second mode, a boost voltage having a predetermined value is provided to the capacitor C1 to adjust the voltage level of a node BLSHF_L such that the precharge offset generated by the node BL can be cancelled.

In this way, it is possible to easily secure: the memory cell sensing margin of sensing circuit 300 of the NAND flash memory cell while reducing power consumption.

It should be noted that the circuits illustrated in FIGS. 10 and 11A are merely example implementations to which the design of clamping unit 130 described above with reference to FIGS. 5 through 9 can be applied. That is, it is obvious to those skilled in the art that the design of clamping unit 130 described above with reference to FIGS. 5 through 9 can be applied to various sensing circuits.

It should be particularly noted that the design of clamping unit 130 described above with reference to FIGS. 5 through 9 is generally applicable to resistive memory devices such as a PRAM, an RRAM and an MRAM as well as to other nonvolatile memory devices such as a NAND flash and a NOR flash. Therefore, the scope of application of the various embodiments described herein is not limited to resistive memory devices.

Specifically, a gate of a transistor included in a nonvolatile memory cell may be connected to a capacitor such as those described above with reference to FIGS. 5 through 9. In addition, a first switch which receives a first read voltage and provides the first read voltage to the transistor and the capacitor, a second switch which connects the capacitor and a source of the transistor, and a third switch which receives a boost voltage and provides the boost voltage to the capacitor may be implemented.

The first through third switches may form different circuit configurations in a first operation mode and a second operation mode corresponding to the first precharge mode and the second precharge mode, as described above with reference to FIGS. 5 through 9.

Figure 12:
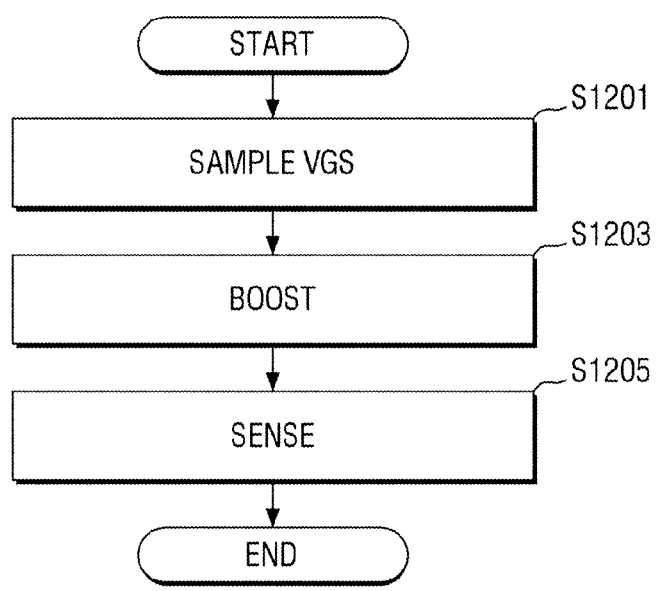
FIG. 12 is a flowchart illustrating a method of operating a memory device.

FIG. 12 is a flowchart illustrating a method of operating a memory device.

Referring to FIG. 12, the method of operating a memory device includes sampling a gate-source voltage VSG of a transistor MN1 while a voltage of a first node N0 is ramped up in a first precharge mode (operation S1201).

In addition, the method includes adjusting (i.e. boosting) a voltage level of a second node N1 using the gate-source voltage VGS of the transistor MN1 and a boost voltage Vboost in a second precharge mode (operation S1203). Here, the term "boost" is a concept encompassing both positive boost and negative boost.

In some embodiments, the adjusting of the voltage level of the second node N1 may include increasing a level of a second read voltage Vcmp1 when data stored in a resistive memory cell 170 corresponds to SET data.

In some embodiments, the adjusting of the voltage level of the second node N1 may include reducing the level of the second read voltage Vcmp1 when the data stored in the resistive memory cell 170 corresponds to RESET data.

The method further includes performing a read operation (i.e., sensing) on resistive memory cell 170 based on the adjusted voltage level of the second node N1 (operation S1205).

According to the various embodiments described above, while a sensing node SN is being precharged, clamping unit 130 ramps up the voltage of the first node N0 and then cancels a precharge offset generated by the first node N0 using a capacitor C. In this way, it is possible to easily secure a sensing margin for memory cells while reducing power consumption.

While the present disclosure has been particularly illustrated and described with reference to example embodiments thereof, it will be understood by those of ordinary skill in the art that various changes in form and detail may be made therein without departing from the spirit and scope of the present disclosure as defined by the following claims. The example embodiments should be considered in a descriptive sense only and not for purposes of limitation.

What is claimed is:

1. A memory device, comprising:
   a resistive memory cell which is connected to a first node, and which includes a variable resistive element and an access element which is configured to control a current flowing through the variable resistive element; and a clamping unit which is connected to the first node, and
which includes a transistor, a capacitor connected to a
gate of the transistor via a second node, a first switch
receiving a first read voltage and configured to selectively provide the first read voltage to the transistor and
the capacitor, a second switch configured to selectively
connect the capacitor and the first node, and a third
switch receiving a boost voltage and configured to
selectively provide the boost voltage to the capacitor,
wherein the clamping unit is configured to ramp up a
voltage of the first node in a first precharge mode and
to adjust a level of a second read voltage of the second
node in a second precharge mode using the first switch,
second switch and third switch.

2. The memory device of claim 1, wherein the capacitor samples a gate-source voltage of the transistor in the first precharge mode.

3. The memory device of claim 2, wherein the capacitor adjusts the level of the second read voltage of the second node using the gate-source voltage of the transistor and the boost voltage in the second precharge mode.

4. The memory device of claim 1, wherein the first switch and the second switch are closed and the third switch is opened in the first precharge mode.

5. The memory device of claim 1, wherein the first switch and the second switch are opened and the third switch is closed in the second precharge mode.

6. The memory device of claim 1, wherein the memory device is configured to perform a read operation on the resistive memory cell based on the second read voltage adjusted by the clamping unit.

7. The memory device of claim 1, further comprising a precharge unit which is connected to a sensing node to precharge the sensing node.

8. The memory device of claim 7, further comprising a current supply unit which is configured to provide to the sensing node a comparison current to be compared with a cell current flowing through the first node in order to read data stored in the resistive memory cell.

9. The memory device of claim 8, further comprising a sense amplifier which is configured to sense the sensing node and to transition an output value when a voltage level of the sensing node is less than a reference voltage.

10. A method of operating a memory device, the method comprising:
providing a resistive memory cell which is connected to a first node, and which includes a variable resistive element and an access element controlling a current flowing through the variable resistive element;
providing to a sensing node a comparison current, which is to be compared with a cell current flowing through the first node, in order to read data stored in the resistive memory cell;
ramping up a voltage of the first node in a first precharge mode;
adjusting a voltage level of a second node in a second precharge mode; and
sensing the sensing node and transitioning an output value when a voltage level of the sensing node is less than a reference voltage.

11. The method of claim 10, wherein ramping up the voltage of the first node comprises sampling a gate-source voltage of a transistor in the first precharge mode.

12. The method of claim 11, wherein adjusting the voltage level of the second node comprises adjusting the voltage level of the second node using the gate-source voltage of the transistor and a boost voltage in the second precharge mode.

13. The method of claim 10, further comprising performing a read operation on the resistive memory cell based on the adjusted voltage level of the second node.

14. The method of claim 10, further comprising precharging the sensing node.

15. The method of claim 10, further comprising providing the comparison current to the sensing node.

16. A memory device, comprising:
a memory cell which is connected to a sensing node via a first node, the sensing node being configured to be precharged to a precharge voltage prior to reading data from the memory cell; and
a clamping unit which is connected between the first node and the sensing node, and which includes a transistor and a capacitor which is configured to be selectively connected between the first node and a control terminal of the transistor,
wherein the clamping unit is configured to ramp up a voltage of the first node and to charge the capacitor in a first precharge period, and to adjust a level of the voltage of the first node in a second precharge period, using a stored voltage charged into the capacitor during the first precharge period.

17. The memory device of claim 16, wherein the clamping unit is configured to increase the level of the voltage of the first node when data stored in the memory cell corresponds to set data.

18. The memory device of claim 16, wherein the clamping unit is configured to reduce the level of the voltage of the first node when the data stored in the memory cell corresponds to reset data.

19. The memory device of claim 16, wherein the capacitor is connected to the control terminal of the transistor via a second node, and wherein the clamping unit further comprises:
a first switch receiving a first read voltage and configured to selectively provide the first read voltage to the transistor and the capacitor,
a second switch configured to selectively connect the capacitor and the first node, and
a third switch receiving a boost voltage and configured to selectively provide the boost voltage to the capacitor,
wherein the clamping unit is configured to ramp up the voltage of the first node in the first precharge period and to adjust a level of a second read voltage of the second node in a second precharge mode using the first switch, second switch and third switch.

20. The memory device of claim 19, wherein the first switch and the second switch are closed and the third switch is opened in the first precharge period, and wherein the first switch and the second switch are opened and the third switch is closed in the second precharge period.

* * * * *